(12) United States Patent
Tsai

(10) Patent No.: US 8,877,647 B2
(45) Date of Patent: Nov. 4, 2014

(54) PATTERNING METHOD AND METHOD OF FORMING MEMORY DEVICE

(71) Applicant: Winbond Electronics Corp., Taichung (TW)

(72) Inventor: Jen-Hsiang Tsai, Changhua County (TW)

(73) Assignee: Winbond Electronics Corp., Taichung (TW)

( * ) Notice: Subject to any disclaimer, the term of this patent is extended or adjusted under 35 U.S.C. 154(b) by 39 days.

(21) Appl. No.: 13/858,094

(22) Filed: Apr. 8, 2013

(65) Prior Publication Data

US 2014/0248773 A1 Sep. 4, 2014

(30) Foreign Application Priority Data

Mar. 1, 2013 (TW) .............................. 102107353 A

(51) Int. Cl.
H01L 21/306 (2006.01)

(52) U.S. Cl.
CPC ................................... *H01L 21/306* (2013.01)
USPC .............................................. 438/696; 216/47

(58) Field of Classification Search
None
See application file for complete search history.

(56) References Cited

U.S. PATENT DOCUMENTS

| | | | | |
|---|---|---|---|---|
| 7,368,362 B2 * | 5/2008 | Tran et al. | ...................... | 438/401 |
| 7,488,685 B2 * | 2/2009 | Kewley | ........................... | 438/689 |
| 8,114,723 B2 * | 2/2012 | Gopalakrishnan et al. | ... | 438/151 |
| 8,247,291 B2 * | 8/2012 | Min et al. | ........................ | 438/257 |
| 8,334,211 B2 * | 12/2012 | Kewley | ........................... | 438/696 |
| 8,455,341 B2 * | 6/2013 | Russell et al. | ................. | 438/585 |
| 8,557,704 B2 * | 10/2013 | Wells et al. | ..................... | 438/689 |
| 2006/0046422 A1 * | 3/2006 | Tran et al. | ...................... | 438/401 |
| 2006/0211260 A1 * | 9/2006 | Tran et al. | ...................... | 438/763 |
| 2006/0216923 A1 * | 9/2006 | Tran et al. | ...................... | 438/622 |
| 2011/0183505 A1 * | 7/2011 | Min et al. | ........................ | 438/586 |
| 2013/0161719 A1 * | 6/2013 | Purayath et al. | .............. | 257/316 |

FOREIGN PATENT DOCUMENTS

| | | |
|---|---|---|
| JP | 2007150166 | 6/2007 |
| JP | 2009054956 | 3/2009 |
| JP | 2010503995 | 2/2010 |
| JP | 2010153481 | 7/2010 |
| JP | 2011228432 | 11/2011 |
| JP | 2012009869 | 1/2012 |
| JP | 2012178378 | 9/2012 |

OTHER PUBLICATIONS

Office Action of Japan Counterpart Application, issued on Apr. 9, 2014, p. 1-p. 3, in which the listed references were cited.

\* cited by examiner

*Primary Examiner* — Allan Olsen
(74) *Attorney, Agent, or Firm* — Jianq Chyun IP Office

(57) ABSTRACT

A method of forming memory device is provided. A substrate having at least two cell areas and at least one peripheral area between the cell areas is provided. A target layer, a sacrificed layer and a first mask layer having first mask patterns in the cell areas and second mask patterns in the peripheral area are sequentially formed on the substrate. Sacrificed layer is partially removed to form sacrificed patterns by using the first mask layer as a mask. Spacers are formed on sidewalls of the sacrificed patterns. The sacrificed patterns and at least the spacers in the peripheral area are removed. A second mask layer is formed in the cell areas. Target layer is partially removed, using the second mask layer and remaining spacers as a mask, to form word lines in the cell areas and select gates in a portion of cell areas adjacent to the peripheral area.

30 Claims, 13 Drawing Sheets

PATTERNING METHOD AND METHOD OF FORMING MEMORY DEVICE

CROSS-REFERENCE TO RELATED APPLICATION

This application claims the priority benefit of Taiwan application serial no. 102107353, filed on Mar. 1, 2013. The entirety of the above-mentioned patent application is hereby incorporated by reference herein and made a part of this specification.

BACKGROUND OF THE INVENTION

1. Field of the Invention

The invention generally relates to a semiconductor process and a method of forming a semiconductor device, and more particularly to a patterning method and a method of forming a memory device.

2. Description of Related Art

A non-volatile memory provides the properties of multiple writing, reading and erasing operations of data, and is able to retain the stored information even when the electrical power is off. As a result, the non-volatile memory is widely used in personal computers and consumer electronic products. As the level of integration of a non-volatile memory is getting higher, the critical dimension (CD) thereof is getting smaller. In order to break through the limitation of the light source resolution in a lithography process, a so-called spacer self-aligned double patterning (SADP) method has been developed to increase the level of integration of the device. However, when word lines of a memory are defined with the current techniques, the line-width of the word lines adjacent to the peripheral area is affected by the peripheral area and therefore unable to be accurately controlled to the target value. Therefore, the critical dimension uniformity (CDU) of the word lines is degraded and the device performance is accordingly reduced.

SUMMARY OF THE INVENTION

Accordingly, the invention is directed to a patterning method and a method of forming a memory device, in which the word lines of the memory can be fabricated with better critical dimension uniformity (CDU).

The present invention provides a patterning method, which includes: providing a substrate having a first area and a second area; sequentially forming a target layer, a sacrificial layer and a first mask layer on the substrate, wherein the first mask layer has a plurality of first mask patterns located in the first area and a plurality of second mask patterns located in the second area; removing a portion of the sacrificial layer by using the first mask layer as a mask, so as to form a plurality of sacrificial patterns; removing the first mask layer; forming a spacer on a sidewall of each of the sacrificial patterns; removing the sacrificial patterns; at least removing the spacers in the second area; forming a second mask layer on the substrate to cover a portion of the first area adjacent to the second area; removing a portion of the target layer by using the second mask layer and the remaining spacers as a mask, so as to form a plurality of first target patterns in the first area and form a second target pattern in the portion of the first area adjacent to the second area; and removing the second mask layer and the remaining spacers.

According to an embodiment of the present invention, a side-edge of the second target pattern is defined by one of the remaining spacers and another side-edge of the second target pattern is defined by the second mask layer.

According to an embodiment of the present invention, the first area is a cell area and the second area is a peripheral area.

According to an embodiment of the present invention, the substrate further has a third area, and the second area is located between the first area and the third area; the first mask layer further has a plurality of third mask patterns located in the third area; the second mask layer further covers a portion of the third area adjacent to the second area; and the step of removing the portion of the target layer by using the second mask layer and the remaining spacers as a mask further includes forming a plurality of third target patterns in the third area and forming another second target pattern in the portion of the third area adjacent to the second area.

According to an embodiment of the present invention, the first area and the third area are cell areas and the second area is a peripheral area.

According to an embodiment of the present invention, a side-edge of the another second target pattern is defined by one of the remaining spacers and another side-edge of the another second target patter is defined by the second mask layer.

According to an embodiment of the present invention, the first mask patterns and the third mask patterns have the same line-width and the same pitch.

According to an embodiment of the present invention, the first mask patterns and the third mask patterns have different line-widths and different pitches.

According to an embodiment of the present invention, a portion of the second mask patterns adjacent to the first area and the first mask patterns in the first area have the same line-width and the same pitch.

According to an embodiment of the present invention, a portion of the second mask patterns adjacent to the third area and the third mask patterns in the third area have the same line-width and the same pitch.

According to an embodiment of the present invention, the step of at least removing the spacers in the second area includes: forming a third mask layer on the substrate to cover a portion of the first area and a portion of the third area and to at least expose the second area; removing the spacers in the second area by using the third mask layer as a mask, wherein the step of removing the spacers in the second area simultaneously removes a portion of the spacers in the first area and the third area, so as to break loops of the spacers corresponding to ends of the sacrificial patterns; and removing the third mask layer.

According to an embodiment of the present invention, wherein the substrate further has a fourth area, and the first area is located between the second area and the fourth area; the first mask layer further has a plurality of third mask patterns located in the fourth area; the second mask layer further covers a portion of the first area adjacent to the fourth area; and the step of removing the portion of the target layer by using the second mask layer and the remaining spacers as a mask further includes forming another second target pattern in the portion of the first area adjacent to the fourth area.

According to an embodiment of the present invention, the first area is a cell area, and the second area and the fourth area are peripheral areas.

According to an embodiment of the present invention, a side-edge of the another second target pattern is defined by one of the remaining spacers and another side-edge of the another second target pattern is defined by the second mask layer.

According to an embodiment of the present invention, a portion of the second mask patterns adjacent to the first area, a portion of the third mask patterns adjacent to the first area, and the first target patterns in the first area have the same line-width and the same pitch.

According to an embodiment of the present invention, the step of at least removing the spacers in the second area includes: forming a third mask layer on the substrate to cover a portion of the first area and to at least expose the second area and the fourth area; removing the spacers in the second area and in the fourth area by using the third mask layer as a mask, wherein the step of removing the spacers in the second area and in the fourth area simultaneously removes a portion of the spacers in the first area, so as to break loops of the spacers corresponding to ends of the sacrificial patterns; and removing the third mask layer.

According to an embodiment of the present invention, a portion of the second mask patterns adjacent to the first area and the first mask patterns in the first area have the same line-width and the same pitch.

According to an embodiment of the present invention, after the step of forming the first mask layer and before the step of forming the sacrificial patterns, the method further includes trimming the first mask layer, wherein a method of trimming the first mask layer includes performing an etching process.

According to an embodiment of the present invention, the step of at least removing the spacers in the second area includes: forming a third mask layer on the substrate to cover a portion of the first area and to at least expose the second area; removing the spacers in the second area by using the third mask layer as a mask, wherein the step of removing the spacers in the second area simultaneously removes a portion of the spacers in the first area, so as to break loops of the spacers corresponding to ends of the sacrificial patterns; and removing the third mask layer.

According to an embodiment of the present invention, a method of forming the first mask layer includes forming the first mask layer on the sacrificial layer through a photomask.

According to an embodiment of the present invention, a method of forming the photomask includes: removing data for defining the second target pattern from an original photomask data; and adding data including a plurality of dummy patterns into a removed area and an adjacent open area.

The present invention further provides a method of forming a memory device, which includes: providing a substrate having at least one cell area and at least one peripheral area; sequentially forming a target layer, a sacrificial layer and a first mask layer on the substrate, wherein the first mask layer has a plurality of first mask patterns located in the cell area and a plurality of second mask patterns located in the peripheral area; removing a portion of the sacrificial layer by using the first mask layer as a mask, so as to form a plurality of sacrificial patterns; removing the first mask layer; forming a spacer on a sidewall of each of the sacrificial patterns; removing the sacrificial patterns; at least removing the spacers in the peripheral area; forming a second mask layer on the substrate to cover a portion of the cell area adjacent to the peripheral area; removing a portion of the target layer by using the second mask layer and the remaining spacers as a mask, so as to form a plurality of word lines in the cell area and a plurality of select gates in the portion of the cell area adjacent to the peripheral area; and removing the second mask layer and the remaining spacers.

According to an embodiment of the present invention, the first mask patterns and the second mask patterns have the same line-width and the same pitch.

According to an embodiment of the present invention, a portion of the second mask patterns adjacent to the cell area and the first mask patterns in the cell area have the same line-width and the same pitch.

According to an embodiment of the present invention, the second mask patterns in the peripheral area are in mirror symmetry.

According to an embodiment of the present invention, after the step of forming the first mask layer and before the step of forming the sacrificial patterns, the method further includes trimming the first mask layer, wherein a method of trimming the first mask layer includes performing an etching process.

According to an embodiment of the present invention, the step of at least removing the spacers in the peripheral area includes: forming a third mask layer on the substrate to cover a portion of the cell area and to at least expose the peripheral area; removing the spacers in the peripheral area by using the third mask layer as a mask, wherein the step of removing the spacers in the peripheral area simultaneously removes a portion of the spacers in the cell area, so as to break loops of the spacers corresponding to ends of the sacrificial patterns; and removing the third mask layer.

According to an embodiment of the present invention, a side-edge of each of the select gates is defined by one of the remaining spacers and another side-edge of each of the select gates is defined by the second mask layer.

According to an embodiment of the present invention, a method of forming the first mask layer includes forming the first mask layer on the sacrificial layer through a photomask.

According to an embodiment of the present invention, a method of forming the photomask includes: removing data for defining the select gates from an original photomask data; and adding data including a plurality of dummy patterns into a removed area and an adjacent open area.

In view of the above, in the patterning method and in the method of forming a memory device of the invention, the select gates of dense areas are removed from the original photomask data. Next, multiple dummy patterns with the same line-width and the same pitch are added into the removed area and an open area adjacent to the dense areas, so as to form a modified photomask data. Since the dummy patterns are added into the open area to form the modified photomask, when the word lines are defined by using the modified photomask, the conventional problem that the line-width of the word lines adjacent to the peripheral area would be affected by the peripheral area can be resolved. As a result, the invention can avoid the conventional poor CDU problem. Therefore, the word lines of the memory can be fabricated with better CDU, without changing the number of the photomasks.

In order to make the features and advantages of the present invention more comprehensible, the present invention is further described in detail in the following with reference to embodiments and the accompanying drawings.

BRIEF DESCRIPTION OF THE DRAWINGS

FIGS. 2C-1 and 2C-2 respectively illustrate a design of a first photomask according to another embodiment of the invention.

DESCRIPTION OF THE EMBODIMENTS

FIG. 1A to FIG. 1M are cross-sectional diagrams showing a patterning method according to an embodiment of the invention.

Figure 1A:
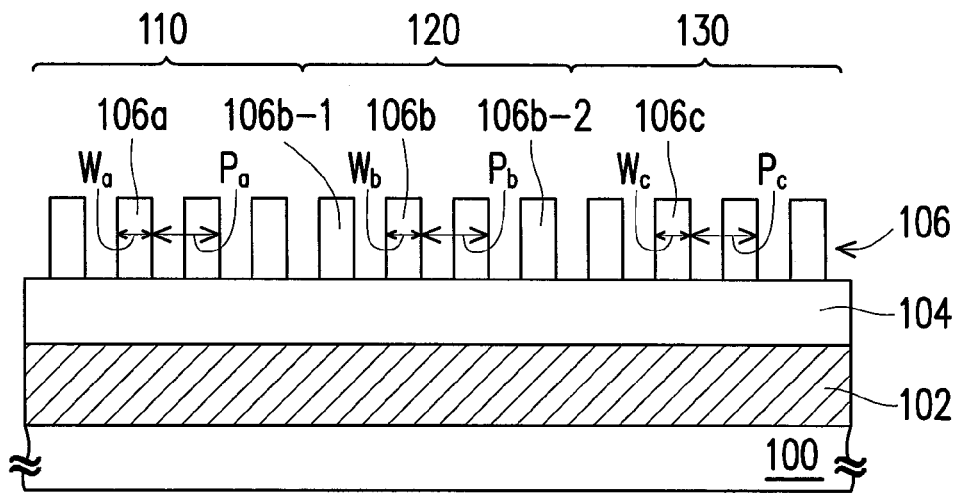
FIG. 1A to FIG. 1M are cross-sectional diagrams showing a patterning method according to an embodiment of the invention.

Referring to FIG. 1A, a substrate 100 is provided. The substrate 100 has a first area 110, a second area 120 and a third area 130. The second area 120 is located between the first area 110 and the third area 130. The substrate 100 is, for example, a silicon substrate or a suitable semiconductor substrate. In an embodiment, both the first area 110 and the third area 130 can be cell areas of a memory, while the second area 120 can be a peripheral area or an open area of the memory. Next, a target layer 102 and a sacrificial layer 104 are sequentially formed on the substrate 100. The target layer 102 is, for example, a single layer or a stacked layer. In an embodiment, when the target layer 102 is a single layer, the material thereof can be doped polysilicon. In another embodiment, when the target layer 102 is a stacked layer including a dielectric layer and a conductive layer, the material of the dielectric layer includes silicon oxide and the material of the conductive layer includes doped polysilicon. The method of forming the target layer 102 includes performing a chemical vapor deposition (CVD) process. The material of the sacrificial layer 104 can be carbon or a suitable material, and the forming method thereof includes performing a CVD process.

Then, a mask layer 106 is formed on the sacrificial layer 104. The mask layer 106 can be a patterned photoresist layer formed through a lithography process. The mask layer 106 has a plurality of first mask patterns 106a in the first area 110, a plurality of second mask patterns 106b in the second area 120 and a plurality of third mask patterns 106c in the third area 130. The second mask patterns 106b include second mask patterns 106b-1 and second mask patterns 106b-2. In addition, a portion of the second mask patterns 106b-1 adjacent to the first area 110 and the first mask patterns 106a in the first area 110 have the same line-width and the same pitch, while a portion of the second mask patterns 106b-2 adjacent to the third area 130 and the third mask patterns 106c in the third area 130 have the same line-width and the same pitch.

In an embodiment, the first mask patterns 106a and the third mask patterns 106c are used to form the word lines of the memory, so that the first mask patterns 106a and the third mask patterns 106c can have the same line-width and the same pitch. That is, the line-width $W_a$ and the pitch $P_a$ of the first mask patterns 106a are respectively the same as the line-width $W_c$ and the pitch $P_c$ of the third mask patterns 106c. In addition, a portion of the second mask patterns 106b-1 adjacent to the first area 110 and the first mask patterns 106a in the first area 110 have the same line-width and the same pitch, while a portion of the second mask patterns 106b-2 adjacent to the third area 130 and the third mask patterns 106c in the third area 130 have the same line-width and the same pitch, and thus, the line-widths $W_a$, $W_b$ and $W_c$ are the same and the pitches $P_a$, $P_b$ and $P_c$ are the same as well. For example, the line-widths $W_a$, $W_b$ and $W_c$ are about 10 nm to 150 nm, and the pitches Pa, Pb and Pc are about 20 nm to 300 nm. However, the invention is not limited thereto. In another embodiment, the first mask patterns 106a and the third mask patterns 106c can have different line-widths and different pitches. In such case, a portion of the second mask patterns 106b-1 adjacent to the first area 110 and a portion of the second mask patterns 106b-2 adjacent to the third area 130 can have different line-widths and different pitches.

In this embodiment, the method of forming the mask layer 106 includes forming a mask layer 106 on the sacrificial layer 104 through a first photomask (not shown).

The first photomask for forming the mask layer 106 is designed to enable that in the mask layer 106, a portion of the second mask patterns 106b-1 adjacent to the first area 110 and the first mask patterns 106a in the first area 110 have the same line-width and the same pitch, and a portion of the second mask patterns 106b-2 adjacent to the third area 130 and the third mask patterns 106c in the third area 130 have the same line-width and the same pitch. In an embodiment, when the first mask patterns 106a and the third mask patterns 106c have the same line-width and the same pitch, the portion of the second mask patterns 106b-1 and the portion of the second mask patterns 106b-2 have the same line-width and the same pitch as well. At this time, at least one of the second mask patterns 106b located at the central region in the second area 120 can have the same line-width and the same pitch as those of the portion of the second mask patterns 106b-1 and the portion of the second mask patterns 106b-2. Alternatively, at least one of the second mask patterns 106b located at the central region in the second area 120 can have the line-width and pitch different from those of the portion of the second mask patterns 106b-1 and the portion of the second mask patterns 106b-2. In another embodiment, when the line-width and pitch of the first mask patterns 106a are different from those of the third mask patterns 106c, the portion of the second mask patterns 106b-1 and the portion of the second mask patterns 106b-2 also have different line-widths and pitches. At this time, at least one of the second mask patterns 106b located at the central region in the second area 120 can have the same line-width and the same pitch as those of the portion of the second mask patterns 106b-1 only, or as those of the portion of the second mask patterns 106b-2 only. Alternatively, at least one of the second mask patterns 106b located at the central region in the second area 120 has the line-width and pitch different from those of the portion of the second mask patterns 106b-1 and the portion of the second mask patterns 106b-2. A design flow of a first photomask is explained as an example in following, in which the first mask patterns 106a and the third mask patterns 106c have the same line-width and the same pitch.

Figure 2A:
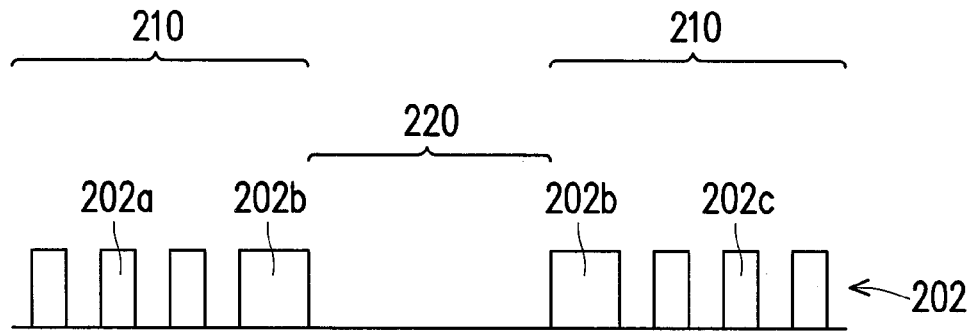
FIG. 2A to FIG. 2C illustrate a process flow for designing a first photomask according to an embodiment of the invention.
Figure 2B:
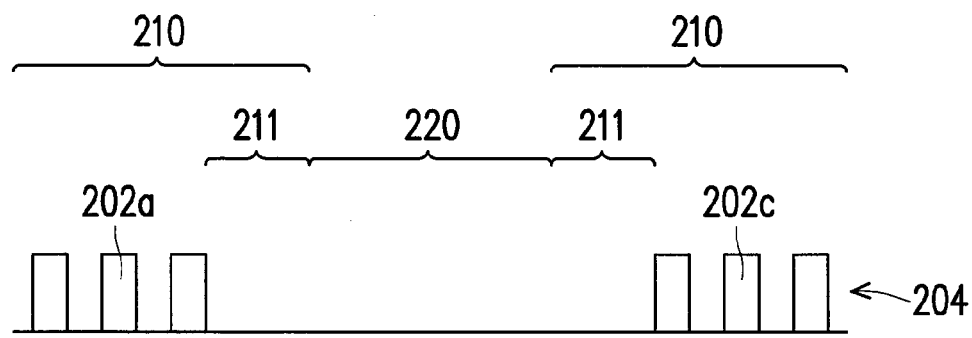
Figure 2C:
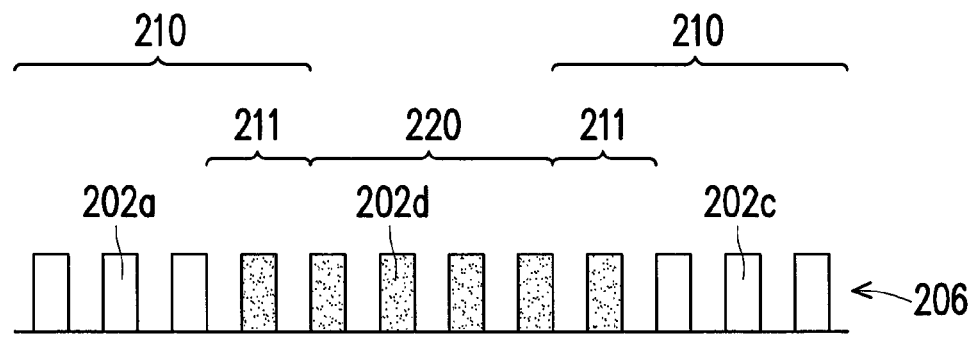

FIG. 2A to FIG. 2C illustrate a process flow for designing a first photomask according to an embodiment of the invention. Referring to FIGS. 2A-2C, the method of forming a first photomask includes the following steps. An original photomask data 202 has two dense areas 210 and one open area 220. The open area 220 is disposed between the two dense areas 210. The first target pattern data 202a, the second target pattern data 202b and the third target pattern data 202c are located in the dense areas 210. For example, the first target pattern data 202a and the third target pattern data 202c are word line data, while the second target pattern data 202b is select gate data.

The second target pattern data 202b is removed from the original photomask data 202 to form a photomask data 204, as shown in FIG. 2B. Then, data 202d including a plurality of dummy patterns is added into the removed area 211 and the adjacent open area 220, so as to form a photomask data 206, as shown in FIG. 2C.

Figures 1, 2C:
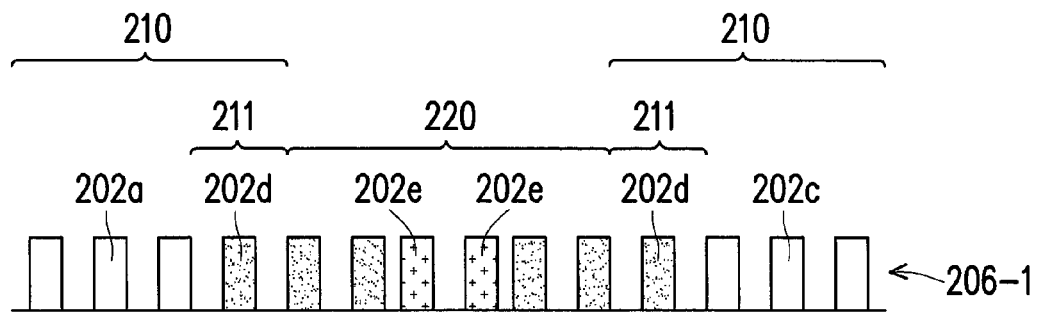
Figures 2, 2C:
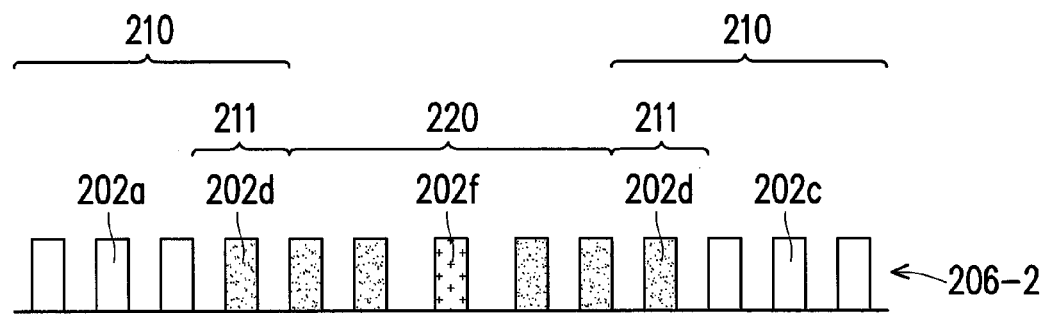

In an embodiment, the dummy patterns of data 202d in the removed area 211 and in the adjacent open area 220 are in mirror symmetry. However, the invention is not limited thereto. For example, the dummy patterns of data 202d in the removed area 211 and in the adjacent open area 220 cannot be in mirror symmetry. In an embodiment, when the space containing the removed area 211 and the adjacent open area 220 allows the addition of data including dummy patterns with the same line-width and the same pitch, a layout of FIG. 2C is established. In another embodiment, when the space containing the removed area 211 and the adjacent open area 220 does not allow the addition of data including dummy patterns with the same line-width and the same pitch, data 202e of two dummy patterns or data 202f of one dummy pattern can be added at the central region of the open area 220. Specifically, when the data 202e of two dummy patterns is added at the central region of the open area 220, the dummy patterns of data 202d and 202e are in mirror symmetry, as shown in the photomask data 206-1 of FIG. 2C-1. When the data 202f of one dummy pattern is added at the central region of the open area 220, the dummy patterns of data 202d and 202f are in mirror symmetry, as shown in the photomask data 206-2 of FIG. 2C-2.

Figure 1B:
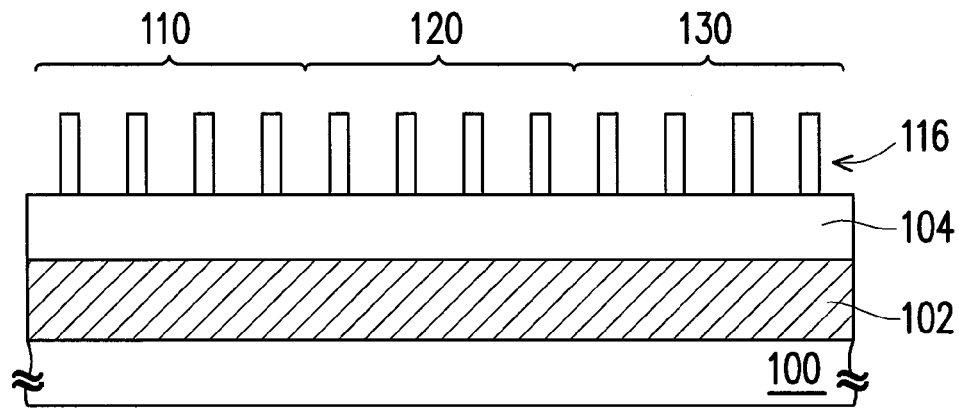

Referring to FIG. 1B, in this embodiment, after forming the mask layer 106, the mask layer 106 is trimmed to form a trimmed mask layer 116. The method of trimming the mask layer 106 includes performing an etching process, such as a dry-etching process. The line-width of the trimmed mask layer 116 is about 5 nm to 80 nm, for example. However, the invention is not limited thereto. The step of trimming the mask layer 106 can be omitted upon the requirements.

Figure 1C:
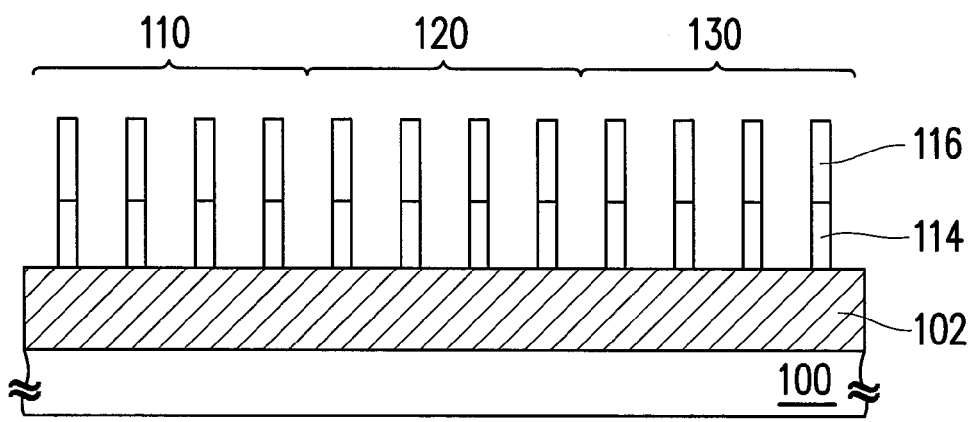
Figure 1D:
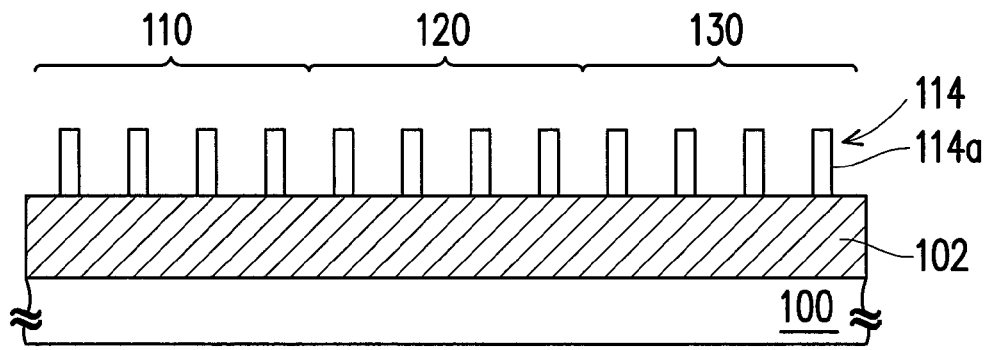

Referring to FIGS. 1C and 1D, a portion of the sacrificial layer 104 is removed by using the trimmed mask layer 116 as a mask, so as to form a plurality of sacrificial patterns 114. The method of removing the portion of the sacrificial layer 104 includes performing a dry-etching process or a wet-etching process. Further, the trimmed mask layer 116 is removed through a wet-etching process.

Figure 1E:
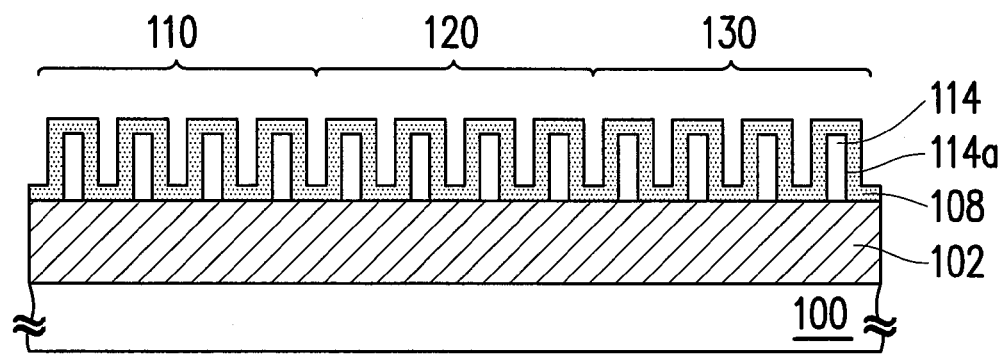
Figure 1F:
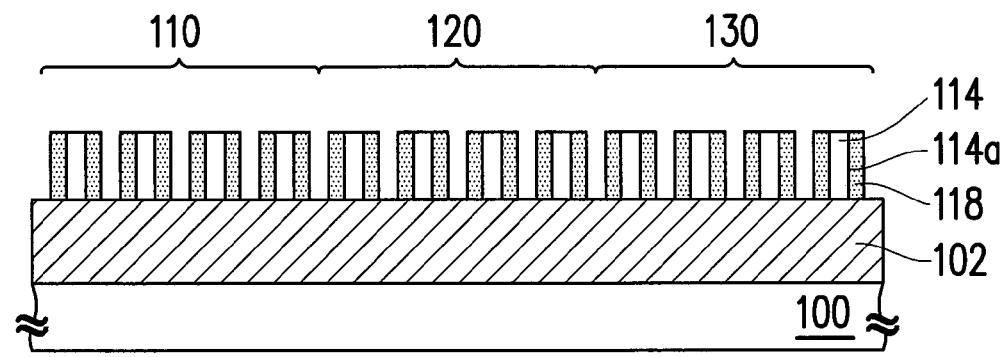

Referring to FIGS. 1E and 1F, a spacer layer 108 is conformably formed on each of the sacrificial patterns 114 and on the target layer 102. An anisotropic etching process is then performed on the spacer layer 108, so as to form a plurality of spacers 118 respectively on sidewalls 114a of the sacrificial patterns 114. The material of the spacer layer 108 can be silicon oxide or a suitable insulation material and the forming method thereof includes performing a CVD process. The thickness of the spacer layer 108 can be about 5-80 nm and the line-width of the spacers 118 can be about 5-80 nm. The required line-width of the spacers 118 can be controlled by the thickness of the spacer layer 108.

Figure 1G:
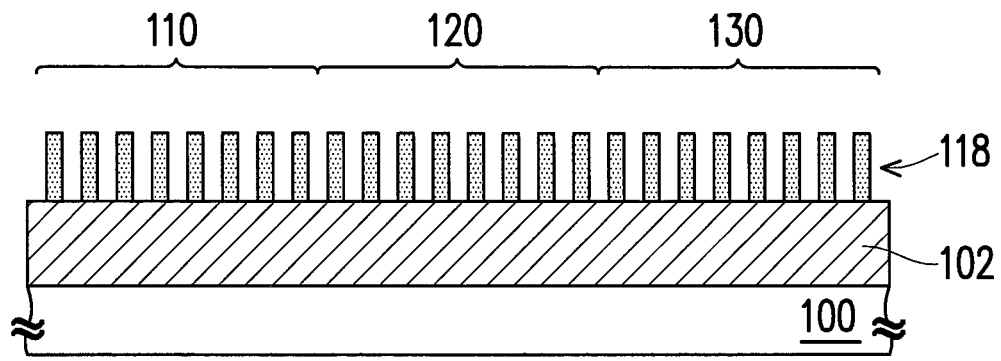

Referring to FIG. 1G, the sacrificial patterns 114 are removed. The removing step includes performing a dry-etching process or a wet-etching process.

Figure 1H:
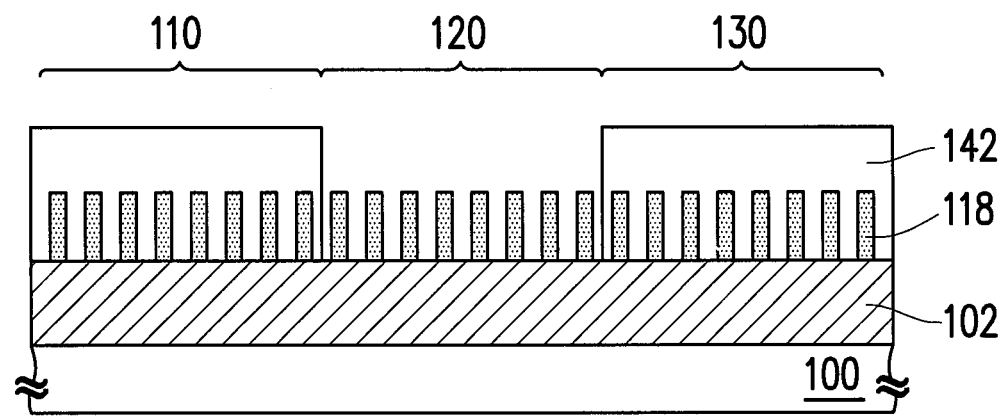
Figure 1I:
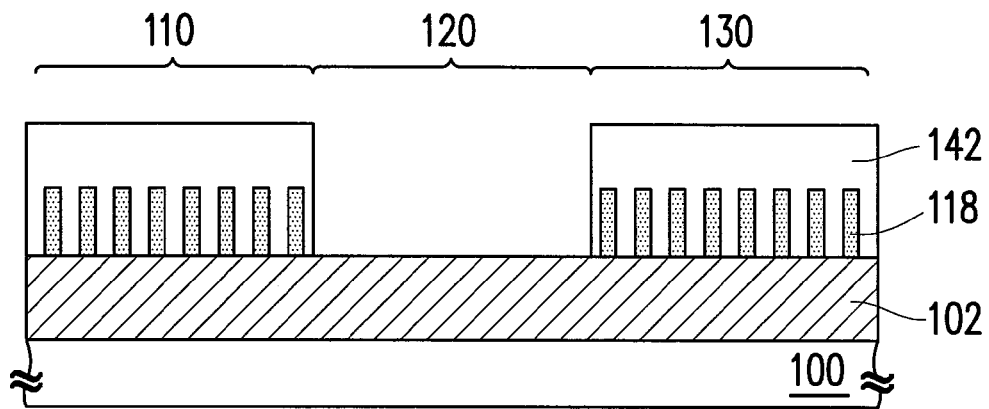
Figure 1J:
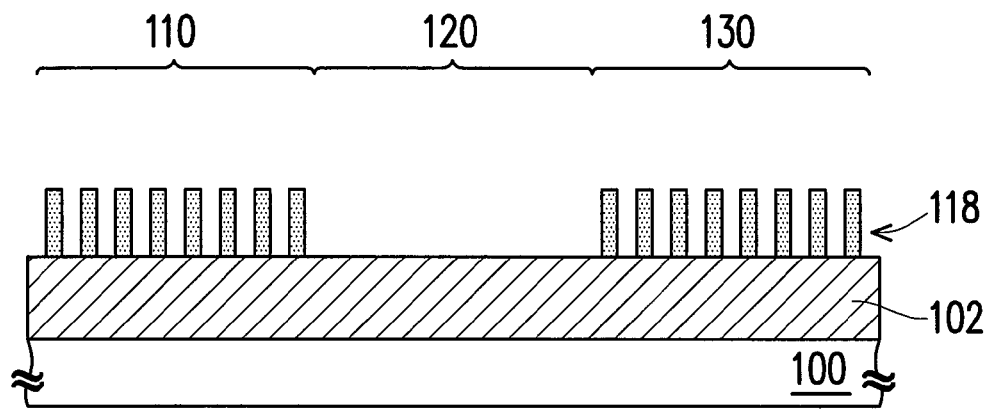

Referring to FIGS. 1H-1J, at least the spacers 118 in the second area 120 are removed. The removing step includes performing a dry-etching process or a wet-etching process. In this embodiment, the step of at least removing the spacers 118 in the second area 120 includes the following steps. A mask layer 142 is formed on the substrate 100 to cover a portion of the first area 110 and a portion of the third area 130 and to expose the second area 120 and the spacers 118 (not shown) corresponding to the ends of the sacrificial patterns 114 in the first area 110 and the third area 130. The mask layer 142 can be a patterned photoresist layer and the forming method thereof includes performing a lithography process by using a second photomask (not shown). The spacers 118 in the second area 120 are removed by using the mask layer 142 as a mask. During the step of removing the spacers 118 in the second area 120, a portion of the spacers 118 in the first area 110 and the third area 130 are simultaneously removed, so as to break the loops of the spacers 118 corresponding to the ends of the sacrificial patterns 114. Then, the mask layer 142 is removed through a wet-etching process.

Figure 1K:
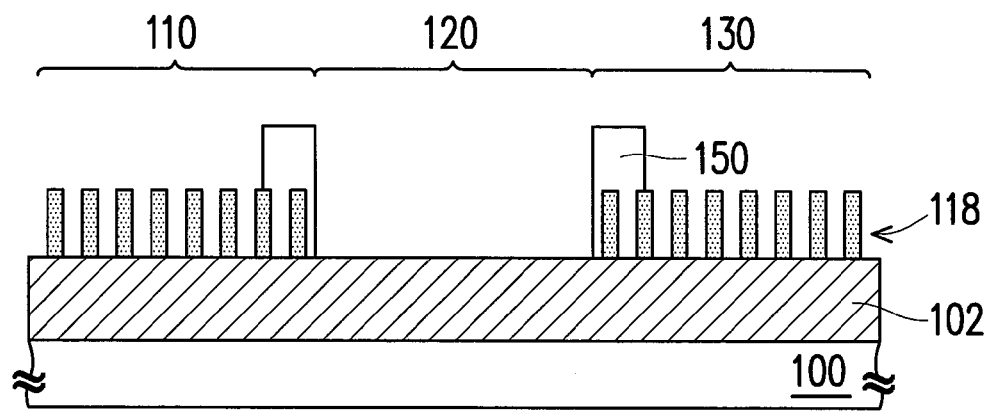
Figure 1L:
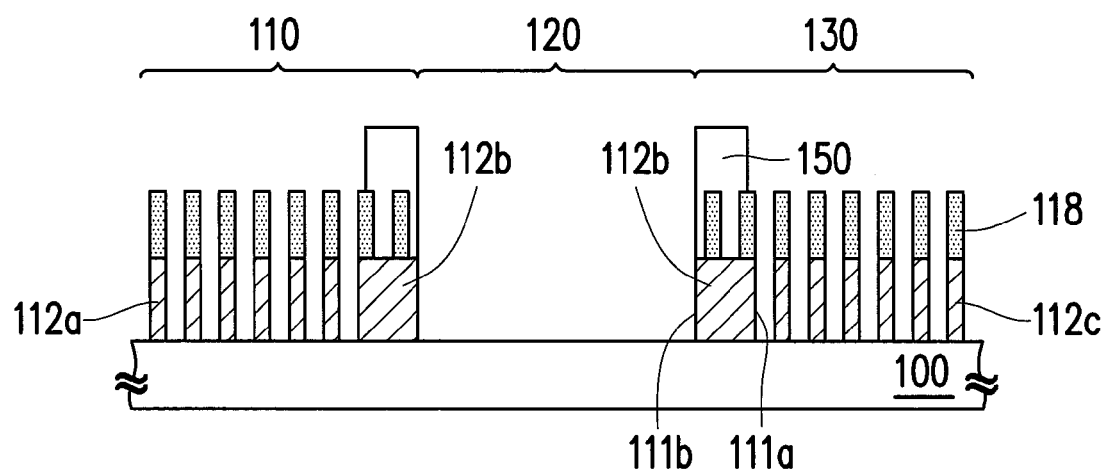
Figure 1M:
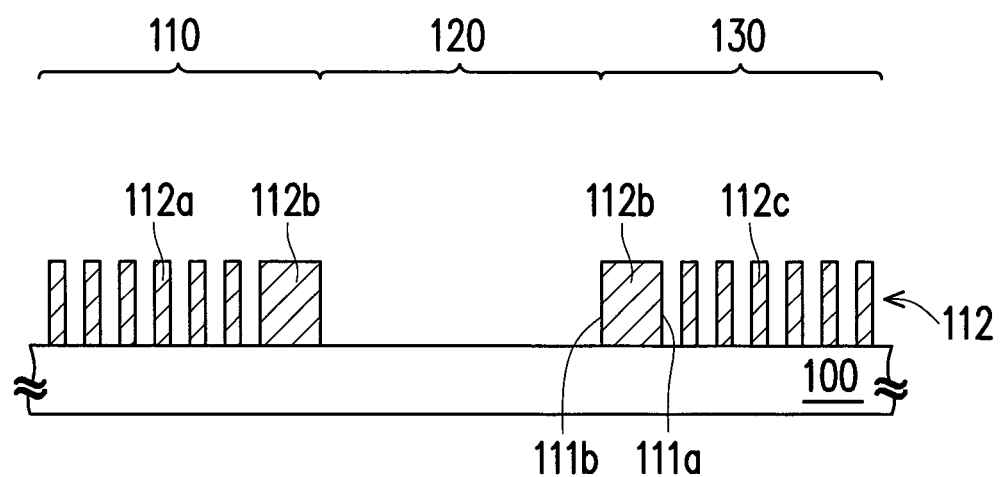

Referring to FIGS. 1K-1M, a mask layer 150 is formed on the substrate 100 to cover a portion of the first area 110 and a portion of the third area 130 both adjacent to the second area 120. The mask layer 150 can be a patterned photoresist layer and the forming method thereof includes performing a lithography process by using a third photomask (not shown). A portion of the target layer 102 is removed by using the mask layer 150 and the remaining spacers 118 as a mask, so as to form a patterned target layer 112. The method of removing the portion of the target layer 102 includes performing a dry-etching process. In more details, the portion of the target layer 102 is removed by using the mask layer 150 and the remaining spacers 118 as a mask, so as to form a plurality of first target patterns 112a in the first area 110, to form a plurality of third target patterns 112c in the third area 130, and to form second target patterns 112b respectively in a portion of the first area 110 adjacent to the second area 120 and in a portion of the third area 130 adjacent to the second area 120. In an embodiment, a side-edge 111a of each of the second target patterns 112b is defined by one of the remaining spacers 118, while another side-edge 111b of each of the second target patterns 112b is defined by the mask layer 150 (or the third photomask). The line-width of the first target patterns 112a can be about 5-80 nm, the line-width of the second target patterns 112b can be about greater than 80 nm, and the line-width of the third target patterns 112c can be about 5-80 nm. In an embodiment, the first target patterns 112a and the third target patterns 112c serve as the word lines of the memory, while the second target patterns 112b serve as the select gates of the memory. Thereafter, the mask layer 150 and the remaining spacers 118 are removed. The method of removing the mask layer 150 includes performing a wet-etching process. The method of removing the remaining spacers 118 includes performing a dry-etching process or a wet-etching process.

The above-mentioned embodiments in which both the first area 110 and the third area 130 are cell areas and the second area 120 between the first area 110 and the third area 130 is a peripheral area (or open area) of the memory are provided for illustration purposes, and are not construed as limiting the present invention. In an embodiment, the peripheral area (or open area) of the invention is not required to be disposed between the two cell areas. The invention can be applied to a patterning process for a device having a memory cell and a peripheral area (or an open area), so as to avoid the conventional poor CDU problem caused by the line-width of the patterns adjacent to the peripheral area being affected by the peripheral area. Two different embodiments are, for example but not limited to, provided in the following.

Referring FIG. 1M, in another embodiment, the substrate 100 includes the first area 110 and the second area 120 but does not include the third area 130, in which the first area 110 is a cell area of the memory, and the second area 120 is a peripheral area (or open area) of the memory. In this embodiment, the patterning method can be the same as the disclosed method of FIGS. 1A-1M, and the details are not iterated herein.

FIG. 3A to FIG. 3G are cross-sectional diagrams showing a patterning method according to another embodiment of the invention.

Figure 3A:
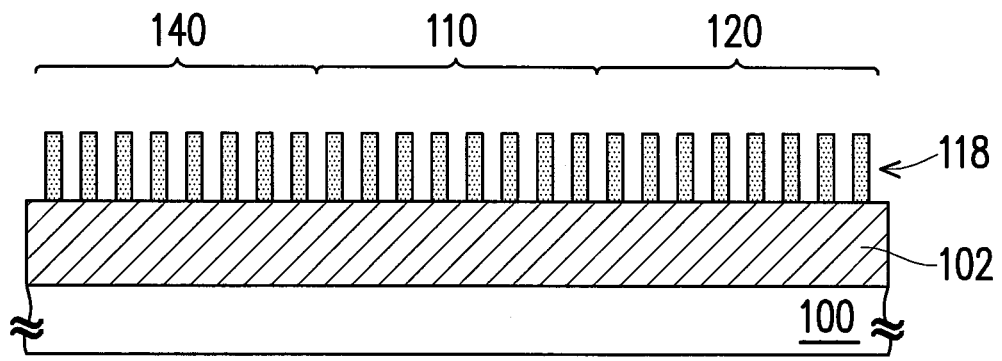
FIG. 3A to FIG. 3G are cross-sectional diagrams showing a patterning method according to another embodiment of the invention.

Referring to FIG. 3A, in yet another embodiment, the substrate 100 includes the first area 110, the second area 120 and a fourth area 140, but does not include the third area 130 in FIG. 1A. The first area 110 is located between the fourth area 140 and the second area 120. In an embodiment, the first area 110 can be a cell area of the memory, and the second area 120 and the fourth area 140 can be peripheral areas of the memory. Then, the target layer 102 and the spacers 118 are formed in the first area 110, in the second area 120 and in the fourth area 140 according to the method disclosed in FIGS. 1A-1G.

Figure 3B:
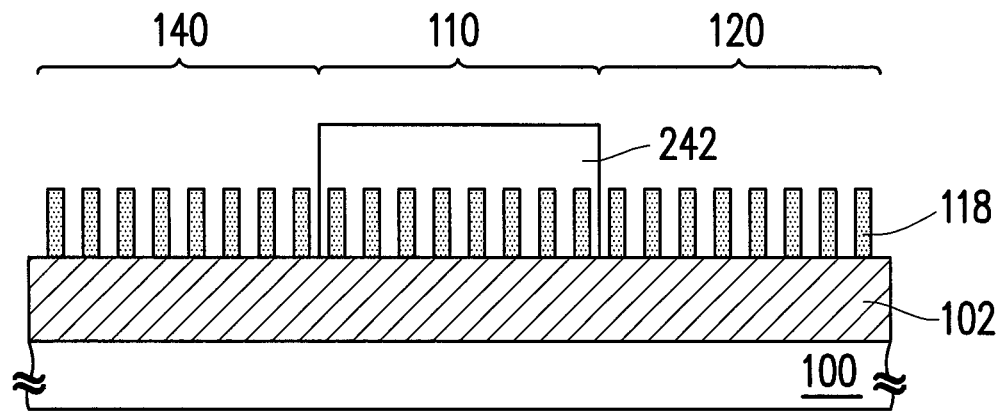
Figure 3C:
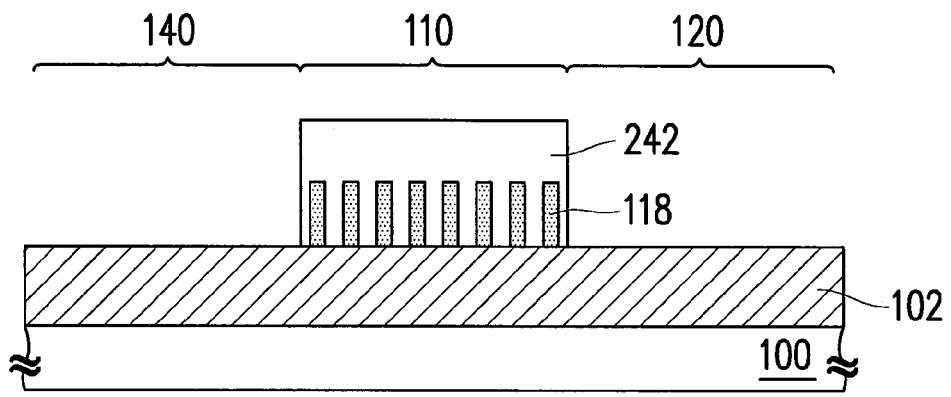
Figure 3D:
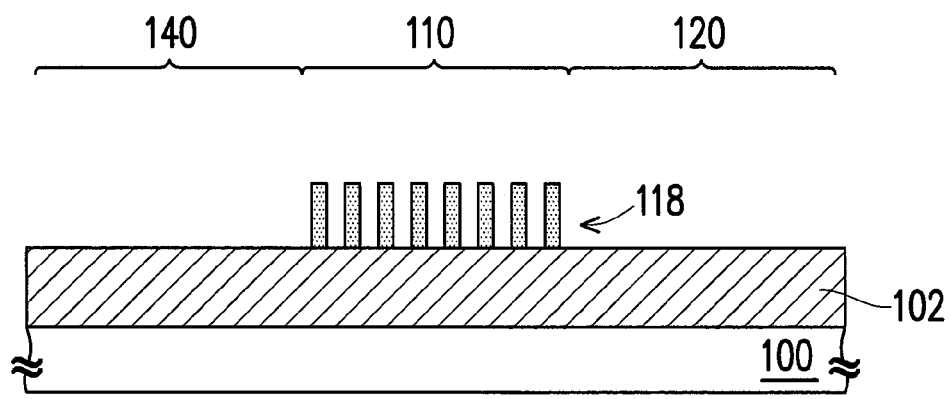

Referring to FIGS. 3B-3D, at least the spacers 118 in the second area 120 and in the fourth area 140 are removed. The method of removing the spacers 118 includes performing a dry-etching process or a wet-etching process. In this embodiment, the step of at least removing the spacers 118 in the second area 120 and in the fourth area 140 includes the following steps. A mask layer 242 is formed on the substrate 100 to cover a portion of the first area 110 and to expose the spacers 118 in the second area 120 and in the fourth area 140 and the spacers (not shown) in a portion of the first area 110 corresponding to the ends of the sacrificial patterns 114. The mask layer 242 can be a patterned photoresist layer and the forming method thereof includes performing a lithography process by using a second photomask (not shown). The spacers 118 in the second area 120 and in the fourth area 140 are removed by using the mask layer 242 as a mask. During the step of removing the spacers 118 in the second area 120 and in the fourth area 140, a portion of the spacers 118 in the first area 110 are simultaneously removed, so as to break the loops of the spacers 118 corresponding to the ends of the sacrificial patterns 114. Then, the mask layer 242 is removed through a wet-etching process.

Figure 3E:
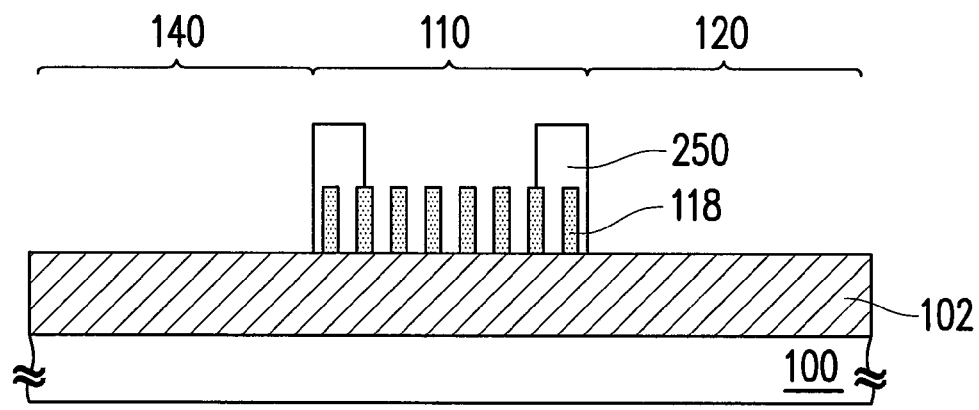
Figure 3F:
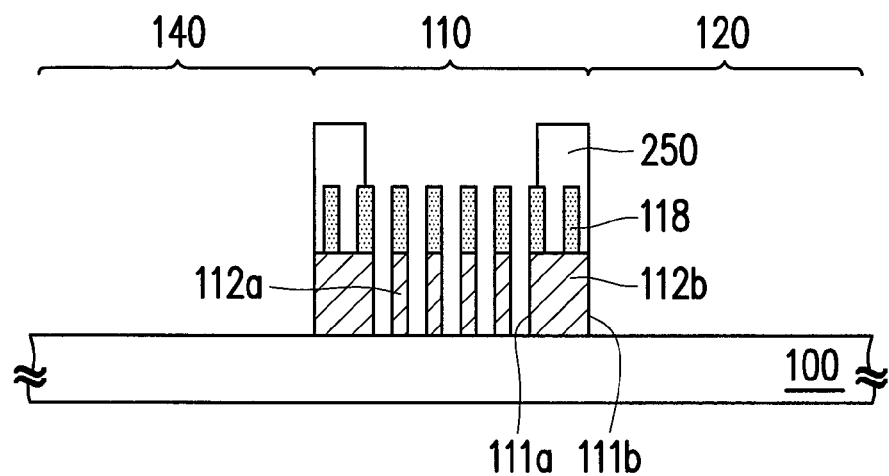
Figure 3G:
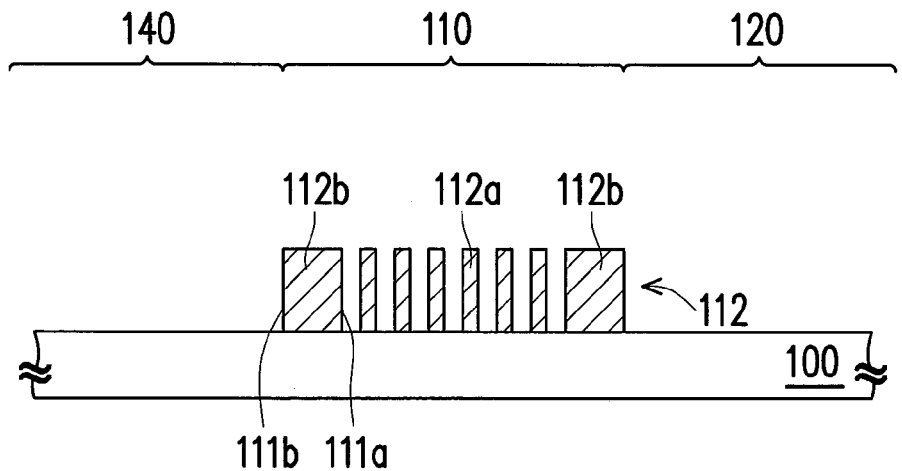

Referring to FIGS. 3E-3G, a mask layer 250 is formed on the substrate 100 to cover a portion of the first area 110 adjacent to the second area 120 and the fourth area 140. The mask layer 250 can be a patterned photoresist layer and the forming method thereof includes performing a lithography process by using a third photomask (not shown). A portion of the target layer 102 is removed by using the mask layer 250 and the remaining spacers 118 as a mask, so as to form a patterned target layer 112. The method of removing the portion of the target layer 102 includes performing a dry-etching process. In more details, the portion of the target layer 102 is removed by using the mask layer 250 and the remaining spacers 118 as a mask, so as to form a plurality of first target patterns 112a in the first area 110, and to form second target patterns 112b in the portion of the first area 110 adjacent to the second area 120 and the fourth area 140. In an embodiment, a side-edge 111a of each of the second target patterns 112b is defined by one of the remaining spacers 118, while another side-edge 111b of each of the second target patterns 112b is defined by the mask layer 250 (or the third photomask). The line-width of the first target patterns 112a can be about 5-80 nm, and the line-width of the second target patterns 112b can be about greater than 80 nm. In an embodiment, the first target patterns 112a serve as the word lines of the memory, while the second target patterns 112b serve as the select gates of the memory. Thereafter, the mask layer 250 and the remaining spacers 118 are removed. The method of removing the mask layer 250 includes performing a wet-etching process. The method of removing the remaining spacers 118 includes performing a dry-etching process or a wet-etching process.

Figure 4:
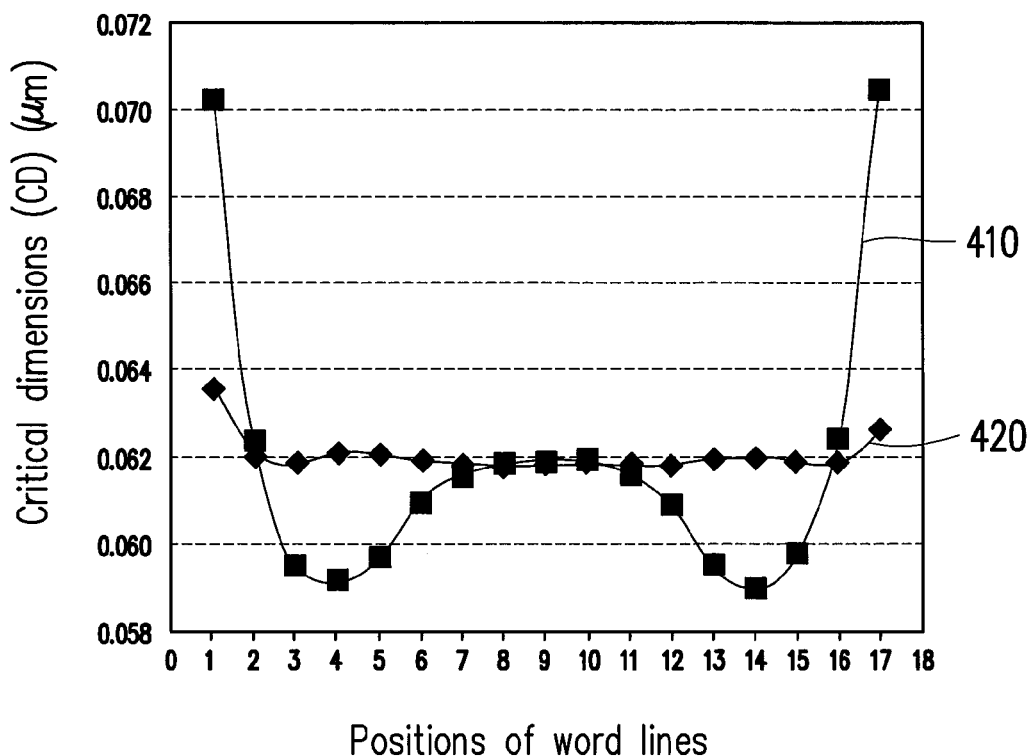
FIG. 4 is a CDU result comparison diagram between the patterning method of the invention and the conventional method.

FIG. 4 is a CDU result comparison diagram between the patterning method of the invention and the conventional method. The curve 410 in FIG. 4 represents a distribution of critical dimensions (i.e., the line-widths of the word lines) obtained by the conventional method, while the curve 420 in FIG. 4 represents a distribution of critical dimensions (i.e., the line-widths of the word lines) obtained by the patterning method of the invention. In FIG. 4, the positions of the word lines are numbered in the order representing the actual positions of the word lines in the cell area(s), in which the two ends of the curves 410 and 420 respectively represent the two word lines in the cell area(s) adjacent to the peripheral area. In the curve 410 of FIG. 4, the distribution range of the CDs obtained with the conventional method (using such as the original photomask data 202 shown in FIG. 2A to form the mask layer) is greater than 10 nm. However, the distribution range of the CDs obtained with the patterning method of the invention (using such as the photomask data 206 or 206-1 or 206-2 in FIG. 2C or 2C-1 or 2C-2) is less than 3 nm. Therefore, the patterning method of the invention can reduce the conventional problem that the CDs at the far-most edges of the word lines are uneasily controlled, so as to provide a better CDU performance.

In summary, in the patterning method and in the method of forming a memory device of the invention, the select gates in dense areas are removed from the original photomask data. Then, multiple dummy patterns with the same line-width and the same pitch are added into the removed area and an open area adjacent to the dense areas, so as to form a modified photomask data. The word lines are defined by the modified photomask. The word lines at the far-most edges are adjacent to the dummy patterns with the same line-width and the same pitch. With the patterning method and the method of forming memory device of the invention, the conventional problem that the CDs at the far-most edges of the word lines are uneasily controlled (i.e. poor CDU) can be resolved. Then, the undesired dummy patterns are removed, followed by formation of the select gates. As a result, the word lines of the memory can be fabricated with better CDU, without changing the number of the photomasks.

It will be apparent to those skilled in the art that the descriptions above are several preferred embodiments of the invention only, which does not limit the implementing range of the invention. Various modifications and variations can be made to the structure of the invention without departing from the scope or spirit of the invention. The claim scope of the invention is defined by the claims hereinafter.

What is claimed is:
1. A patterning method, comprising:
providing a substrate having a first area and a second area;
sequentially forming a target layer, a sacrificial layer and a first mask layer on the substrate, wherein the first mask layer has a plurality of first mask patterns located in the first area and a plurality of second mask patterns located in the second area;
removing a portion of the sacrificial layer by using the first mask layer as a mask, so as to form a plurality of sacrificial patterns;
removing the first mask layer;
forming a spacer on a sidewall of each of the sacrificial patterns;
removing the sacrificial patterns;
at least removing the spacers in the second area;
forming a second mask layer on the substrate to cover a portion of the first area adjacent to the second area;
removing a portion of the target layer by using the second mask layer and the remaining spacers as a mask, so as to form a plurality of first target patterns in the first area and form a second target pattern in the portion of the first area adjacent to the second area; and
removing the second mask layer and the remaining spacers.

2. The patterning method as claimed in claim 1, wherein a side-edge of the second target pattern is defined by one of the remaining spacers and another side-edge of the second target pattern is defined by the second mask layer.

3. The patterning method as claimed in claim 1, wherein the first area is a cell area and the second area is a peripheral area.

4. The patterning method as claimed in claim 1, wherein the substrate further has a third area, and the second area is located between the first area and the third area;
the first mask layer further has a plurality of third mask patterns located in the third area;
the second mask layer further covers a portion of the third area adjacent to the second area; and
the step of removing the portion of the target layer by using the second mask layer and the remaining spacers as a mask further comprises forming a plurality of third target patterns in the third area and forming another second target pattern in the portion of the third area adjacent to the second area.

5. The patterning method as claimed in claim 4, wherein the first area and the third area are cell areas and the second area is a peripheral area.

6. The patterning method as claimed in claim 4, wherein a side-edge of the another second target pattern is defined by one of the remaining spacers and another side-edge of the another second target patter is defined by the second mask layer.

7. The patterning method as claimed in claim 4, wherein the first mask patterns and the third mask patterns have the same line-width and the same pitch.

8. The patterning method as claimed in claim 4, wherein the first mask patterns and the third mask patterns have different line-widths and different pitches.

9. The patterning method as claimed in claim 4, wherein a portion of the second mask patterns adjacent to the first area and the first mask patterns in the first area have the same line-width and the same pitch.

10. The patterning method as claimed in claim 4, wherein a portion of the second mask patterns adjacent to the third area and the third mask patterns in the third area have the same line-width and the same pitch.

11. The patterning method as claimed in claim 4, wherein the step of at least removing the spacers in the second area comprises:
forming a third mask layer on the substrate to cover a portion of the first area and a portion of the third area and to at least expose the second area;
removing the spacers in the second area by using the third mask layer as a mask, wherein the step of removing the spacers in the second area simultaneously removes a portion of the spacers in the first area and the third area, so as to break loops of the spacers corresponding to ends of the sacrificial patterns; and
removing the third mask layer.

12. The patterning method as claimed in claim 1, wherein the substrate further has a fourth area, and the first area is located between the second area and the fourth area;
the first mask layer further has a plurality of third mask patterns located in the fourth area;
the second mask layer further covers a portion of the first area adjacent to the fourth area; and
the step of removing the portion of the target layer by using the second mask layer and the remaining spacers as a mask further comprises forming another second target pattern in the portion of the first area adjacent to the fourth area.

13. The patterning method as claimed in claim 12, wherein the first area is a cell area, and the second area and the fourth area are peripheral areas.

14. The patterning method as claimed in claim 12, wherein a side-edge of the another second target pattern is defined by one of the remaining spacers and another side-edge of the another second target pattern is defined by the second mask layer.

15. The patterning method as claimed in claim 12, wherein a portion of the second mask patterns adjacent to the first area, a portion of the third mask patterns adjacent to the first area, and the first target patterns in the first area have the same line-width and the same pitch.

16. The patterning method as claimed in claim 12, wherein the step of at least removing the spacers in the second area comprises:
forming a third mask layer on the substrate to cover a portion of the first area and to at least expose the second area and the fourth area;
removing the spacers in the second area and in the fourth area by using the third mask layer as a mask, wherein the step of removing the spacers in the second area and in the fourth area simultaneously removes a portion of the spacers in the first area, so as to break loops of the spacers corresponding to ends of the sacrificial patterns; and
removing the third mask layer.

17. The patterning method as claimed in claim 1, wherein a portion of the second mask patterns adjacent to the first area and the first mask patterns in the first area have the same line-width and the same pitch.

18. The patterning method as claimed in claim 1, after the step of forming the first mask layer and before the step of forming the sacrificial patterns, further comprising trimming the first mask layer, wherein a method of trimming the first mask layer comprises performing an etching process.

19. The patterning method as claimed in claim 1, wherein the step of at least removing the spacers in the second area comprises:
forming a third mask layer on the substrate to cover a portion of the first area and to at least expose the second area;
removing the spacers in the second area by using the third mask layer as a mask, wherein the step of removing the spacers in the second area simultaneously removes a portion of the spacers in the first area, so as to break loops of the spacers corresponding to ends of the sacrificial patterns; and
removing the third mask layer.

20. The patterning method as claimed in claim 1, wherein a method of forming the first mask layer comprises forming the first mask layer on the sacrificial layer through a photomask.

21. The patterning method as claimed in claim 20, wherein a method of forming the photomask comprises:
removing data for defining the second target pattern from an original photomask data; and
adding data comprising a plurality of dummy patterns into a removed area and an adjacent open area.

22. A method of forming a memory device, comprising:
providing a substrate having at least one cell area and at least one peripheral area;
sequentially forming a target layer, a sacrificial layer and a first mask layer on the substrate, wherein the first mask layer has a plurality of first mask patterns located in the cell area and a plurality of second mask patterns located in the peripheral area;

removing a portion of the sacrificial layer by using the first mask layer as a mask, so as to form a plurality of sacrificial patterns;

removing the first mask layer;

forming a spacer on a sidewall of each of the sacrificial patterns;

removing the sacrificial patterns;

at least removing the spacers in the peripheral area;

forming a second mask layer on the substrate to cover a portion of the cell area adjacent to the peripheral area;

removing a portion of the target layer by using the second mask layer and the remaining spacers as a mask, so as to form a plurality of word lines in the cell area and a plurality of select gates in the portion of the cell area adjacent to the peripheral area; and removing the second mask layer and the remaining spacers.

23. The method as claimed in claim 22, wherein the first mask patterns and the second mask patterns have the same line-width and the same pitch.

24. The method as claimed in claim 22, wherein a portion of the second mask patterns adjacent to the cell area and the first mask patterns in the cell area have the same line-width and the same pitch.

25. The method as claimed in claim 24, wherein the second mask patterns in the peripheral area are in mirror symmetry.

26. The method as claimed in claim 22, after the step of forming the first mask layer and before the step of forming the sacrificial patterns, further comprising trimming the first mask layer, wherein a method of trimming the first mask layer comprises performing an etching process.

27. The method as claimed in claim 22, wherein the step of at least removing the spacers in the peripheral area comprises:

forming a third mask layer on the substrate to cover a portion of the cell area and to at least expose the peripheral area;

removing the spacers in the peripheral area by using the third mask layer as a mask, wherein the step of removing the spacers in the peripheral area simultaneously removes a portion of the spacers in the cell area, so as to break loops of the spacers corresponding to ends of the sacrificial patterns; and removing the third mask layer.

28. The method as claimed in claim 22, wherein a side-edge of each of the select gates is defined by one of the remaining spacers and another side-edge of each of the select gates is defined by the second mask layer.

29. The method as claimed in claim 22, wherein a method of forming the first mask layer comprises forming the first mask layer on the sacrificial layer through a photomask.

30. The method as claimed in claim 29, wherein a method of forming the photomask comprises:

removing data for defining the select gates from an original photomask data; and adding data comprising a plurality of dummy patterns into a removed area and an adjacent open area.

* * * * *